United States Patent [19]
Ishikawa et al.

[11] Patent Number: 5,600,289
[45] Date of Patent: Feb. 4, 1997

[54] MEASURING JIG USED FOR EVALUATION OF A DEVICE WITH A NONRADIATIVE DIELECTRIC WAVEGUIDE

[75] Inventors: Youhei Ishikawa; Toru Tanizaki, both of Kyoto; Hiroshi Nishida, Kawanishi; Norimitsu Tsukai, Sagamihara; Atsushi Saito, Nagaokakyo, all of Japan

[73] Assignee: Murata Manufacturing Co., Ltd., Japan

[21] Appl. No.: 520,307

[22] Filed: Aug. 28, 1995

[30]     Foreign Application Priority Data

Aug. 30, 1994   [JP]   Japan ................................ 6-205426

[51] Int. Cl.$^6$ ............................................. H01P 5/00
[52] U.S. Cl. ........................ 333/248; 333/21 R; 333/254; 324/632
[58] Field of Search ................................ 333/1.1, 21 R, 333/239, 248, 254–257; 324/632

[56]              References Cited

U.S. PATENT DOCUMENTS 3,995,238  11/1976  Knox et al. ....................... 333/21 R
5,473,296  12/1995  Ishikawa et al. ...................... 333/239

*Primary Examiner*—Paul Gensler
*Attorney, Agent, or Firm*—Ostrolenk, Faber, Gerb & Soffen, LLP

[57]              ABSTRACT

A measuring jig which is used to measure characteristics of a device with a nonradiative dielectric waveguide which operates in a microwave band or in a millimeter wave band. The measuring jig has a mount section on which a device with a nonradiative dielectric waveguide is to be mounted, and a converting section which connects the device to an external circuit. The converting section has a couple of parallel conductors, a dielectric strip which is disposed between the conductors and propagates a high-frequency electromagnetic wave in a specified mode, and an end surface which is formed on an end of the conductors so as to be vertical to a traveling direction of the electromagnetic wave propagated in the dielectric strip and on which an end of the dielectric strip is exposed.

4 Claims, 17 Drawing Sheets

F I G. 5A
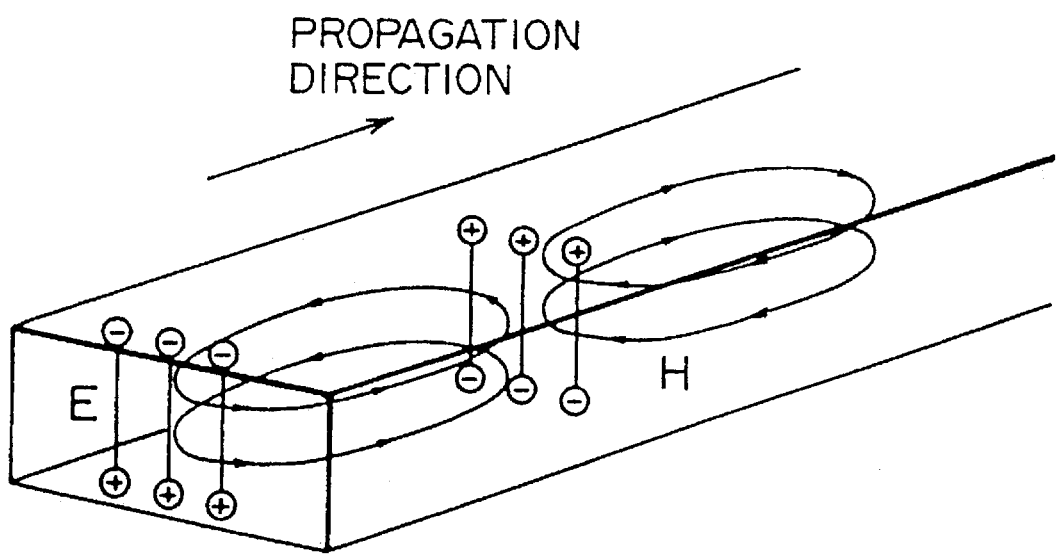
F I G. 5B
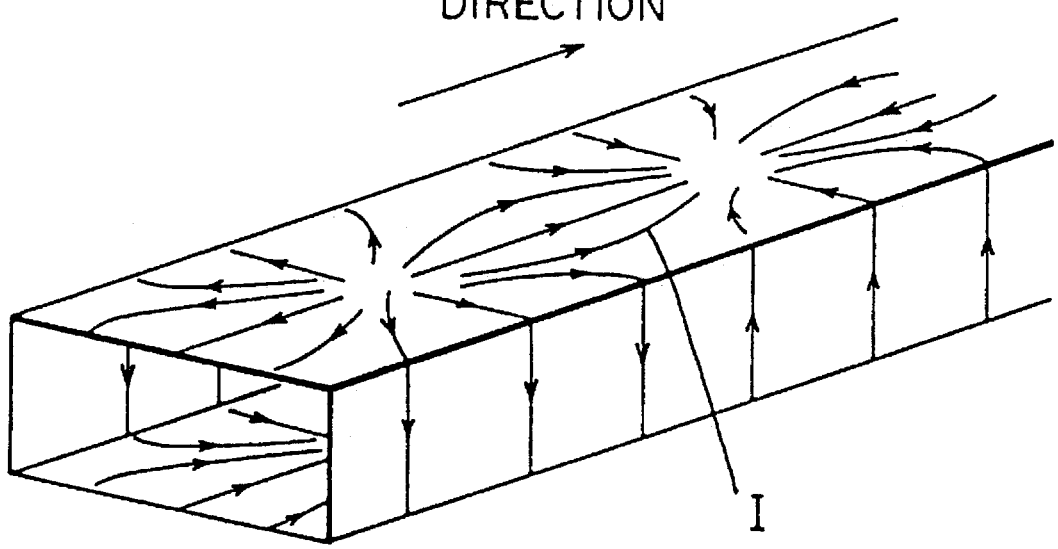

F I G. 9A
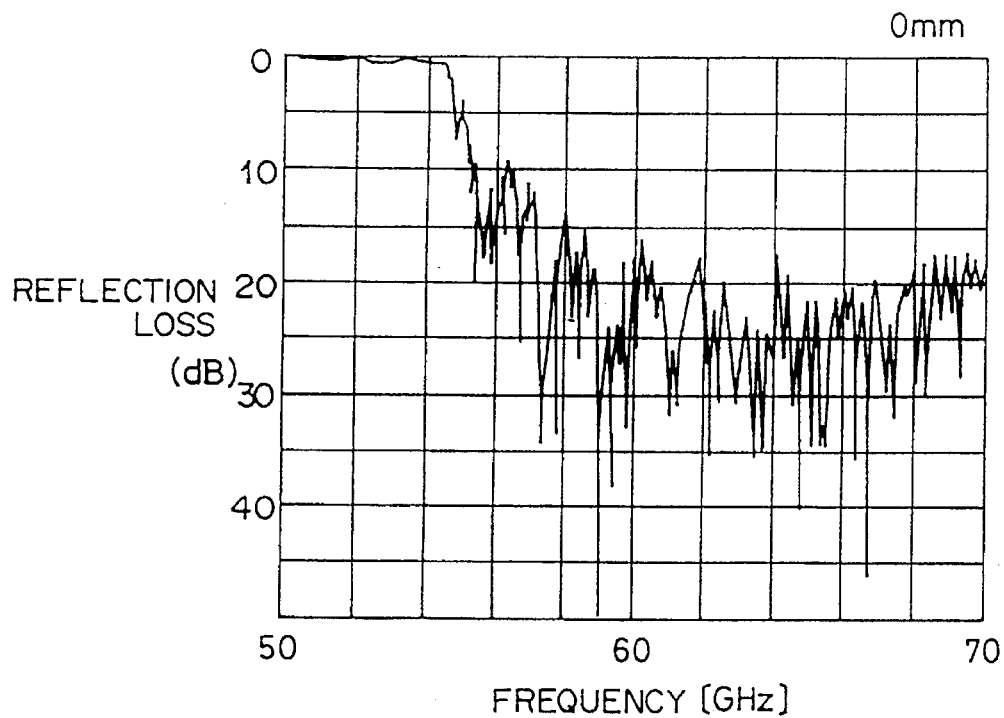
F I G. 9B
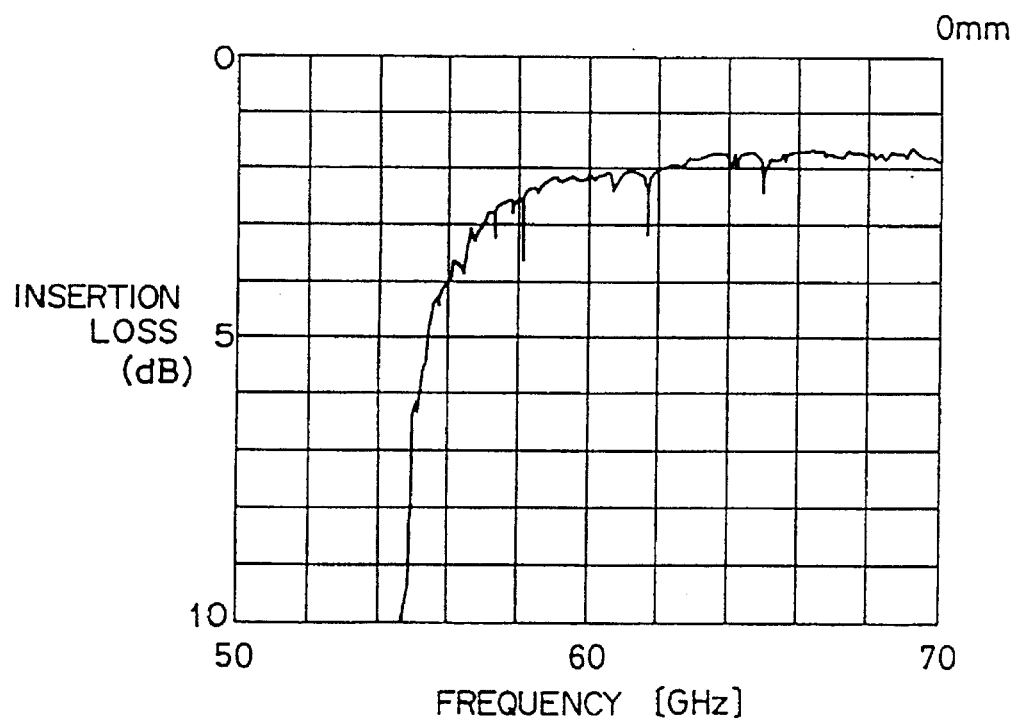

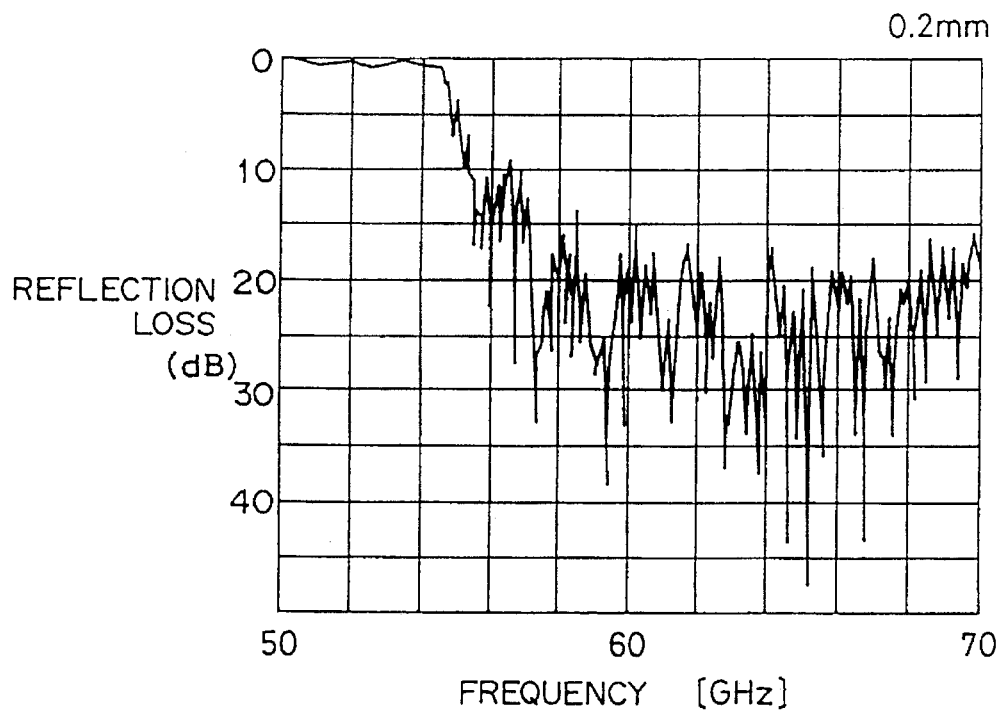
F I G. 11A
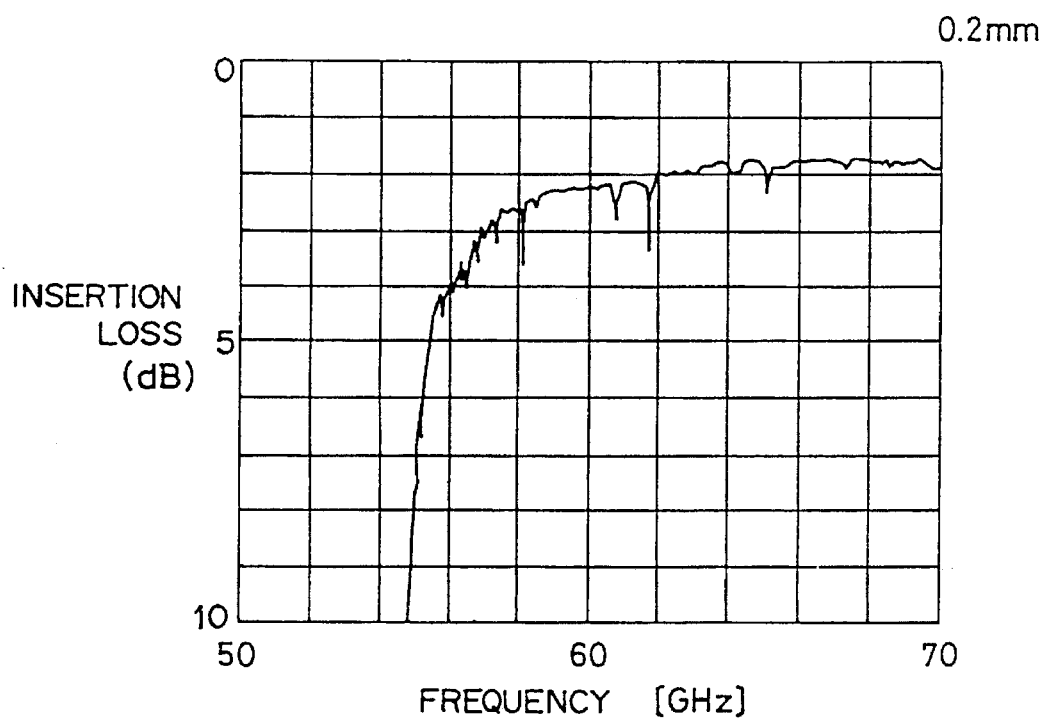
F I G. 11B

F I G. 12A
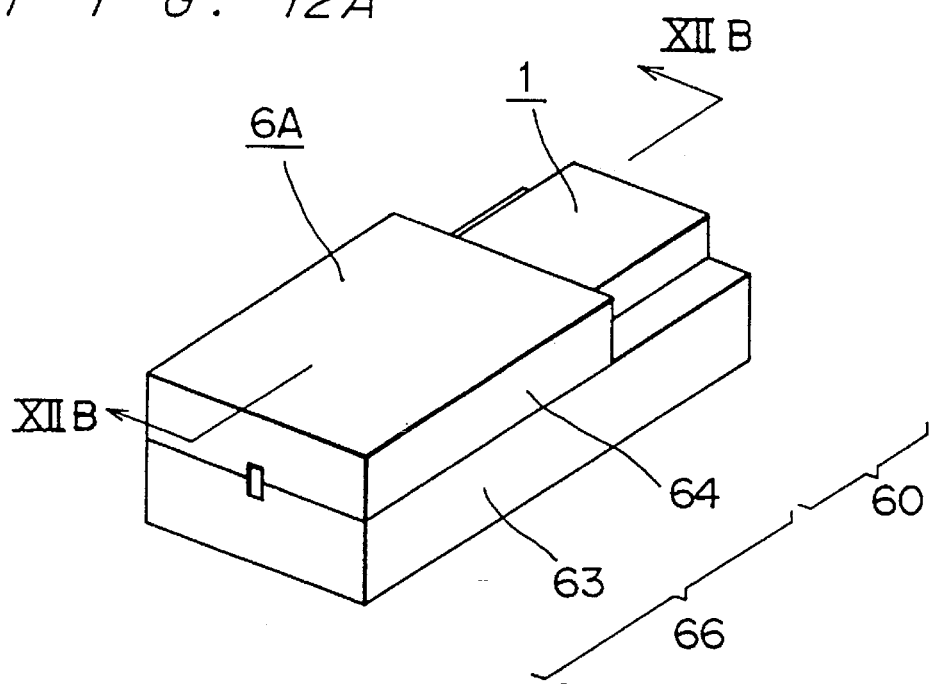
F I G. 12B
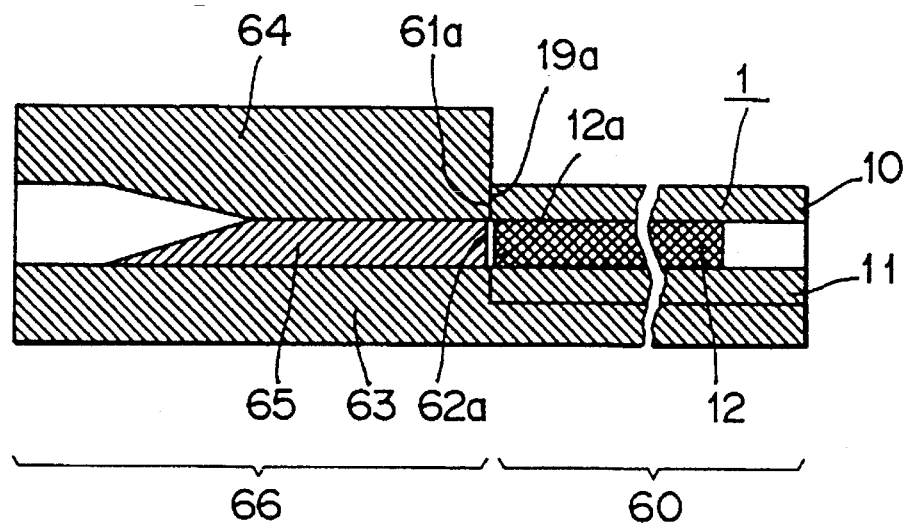

5,600,289

MEASURING JIG USED FOR EVALUATION OF A DEVICE WITH A NONRADIATIVE DIELECTRIC WAVEGUIDE

CROSS-REFERENCE TO RELATED APPLICATION

This application is related to application Ser. Nos. 08/520,100 filed Aug. 28, 1995, entitled "DEVICE WITH A NONRADIATIVE DIELECTRIC WAVEGUIDE" and 08/519,949 filed Aug. 28, 1995 entitled "HIGH FREQUENCY INTEGRATED CIRCUIT."

BACKGROUND OF THE INVENTION

1. Field of the Invention

The present invention relates to a measuring jig used for evaluation of a device with a nonradiative dielectric waveguide, and more particularly to a measuring jig which is used to measure characteristics of a device which has a nonradiative dielectric waveguide and operates in a microwave band or in a millimeter wave band.

2. Description of Related Art

Recently, various devices with a nonradiative dielectric waveguide which operate in a microwave band or in a millimeter wave band, such as an oscillator, a circulator, etc., have been developed, and simultaneously, measuring jigs which are used to measure characteristics of such devices have been developed.

FIG. 17 is a perspective view of a conventional device 101 with a nonradiative dielectric waveguide and a conventional measuring jig 102. The device 101 is, for example, an oscillator. The device 101 comprises conductive plates 1001 and 1002, spacers 1003 for keeping the conductive plates 1001 and 1002 parallel to each other, a dielectric strip 1005 which propagates an electromagnetic wave in LSM01 mode, and bolts 1007 and nuts 1008 for fixing the dielectric strip 1005 between the conductive plates 1001 and 1002. The conductive plates 1001 and 1002 have an end surface 1001a which is vertical to a direction in which an electromagnetic wave propagated in the dielectric strip 1005 travels. The dielectric strip 1005 has an end 1005b which is protruded from the end surface 1001a, and the device 101 is connected to the measuring jig 102 at this protruded end 1005b. The end 1005b is tapered in the width way such that the characteristic impedance of the device 101 will match the characteristic impedance of a transmission line.

The measuring jig 102 has a horn 1021 and a metal tubular waveguide 1022 in order to connect the device 101 to a transmission line (for example, a metal tubular waveguide). A flange 1022a is provided at an end of the metal tubular waveguide 1022.

FIG. 18 shows the internal structure when the end 1005b of the dielectric strip 1005 is inserted in the measuring jig 102. The metal tubular waveguide 1022 propagates an electromagnetic wave in TE10 mode, and has a width W1 of 1.88 mm and a height H1 of 3.76 mm. The dielectric strip 1005 has a height a of 2.25 mm. The horn 1021 is the same height as the waveguide 1022 at the adjoining portion to the waveguide 1022. The horn 1021 is tapered in the height way toward the device 101, and at the adjoining portion to the dielectric strip 1005, the horn 1021 is the same height as the dielectric strip 1005. The horn 1021 is the same width as the waveguide 1022 at the adjoining portion to the waveguide 1022, and the width becomes larger gradually toward the device 101. With this structure, the characteristic impedance of the electromagnetic wave propagated in the dielectric strip 1005 in LSM01 mode matches the characteristic impedance of the electromagnetic wave propagated in the waveguide 1022 in TE10 mode.

For evaluation of the device 101, the device 101 is put closer to the measuring jig 102, and the end 1005b of the dielectric strip 1005 of the device 101 is inserted into the horn 1021 of the measuring jig 102. Then, characteristics of the device 101 are measured by a measuring instrument (not shown) such as a network analyzer. After the evaluation, the device 101 is put away from the measuring jig 102, and the end 1005b of the dielectric strip 1005 is pulled out of the horn 1021.

Every time the device 101 is evaluated, the end 1005b of the dielectric strip 1005 is inserted into and pulled out of the horn 1021 of the measuring jig 102. Therefore the positioning between the dielectric strip 1005 of the device 101 and the horn 1021 of the measuring jig 102 is unstable, and mismatching is likely to occur. Consequently, the results of the evaluation of the device 101 vary.

SUMMARY OF THE INVENTION

An object of the present invention is to provide a measuring jig which permits accurate evaluation of a device with a nonradiative dielectric waveguide.

In order to attain the object, according to the present invention, a measuring jig used for evaluation of a device with a nonradiative dielectric waveguide comprises: a mount section on which a device with a nonradiative dielectric waveguide is to be mounted, the mount section having a surface which is to entirely come into contact with a mounting surface of the device; a converting section which is integral with the mount section and connects the device with a nonradiative dielectric waveguide mounted on the mount section to an external circuit, the converting section comprising: a couple of conductors which are parallel to each other at a specified space; a dielectric strip which is disposed between the conductors; and an end surface which is formed on an end of the conductors so as to be vertical to a direction in which an electromagnetic wave is propagated in the dielectric strip, an end of the dielectric strip being exposed on the end surface.

This structure solves the problem that the positioning between a dielectric strip of a device to be evaluated and a horn of a measuring jig is unstable. In the structure according to the present invention, a device with a nonradiative dielectric waveguide is mounted on the mount section of the measuring jig such that the mounting surface of the device is entirely in contact with the mount section. In this state, an electromagnetic wave is propagated from the dielectric strip of the device to the dielectric strip of the measuring jig in a specified mode without mismatching and with a small loss, and therefore, characteristics of the device can be measured accurately.

BRIEF DESCRIPTION OF THE DRAWINGS

This and other objects and features of the present invention will be apparent from the following description with reference to the accompanying drawings, in which:

FIG. 5A is a distribution chart which shows an electric field and a magnetic field of an electromagnetic wave which is propagated in a metal tubular waveguide in TE10 mode;

FIG. 5B is a distribution chart which shows a surface current of the electromagnetic wave which is propagated in the metal tubular waveguide in TE10 mode;

FIG. 9A is a graph which shows a reflection loss characteristic of the oscillator when the conductive plates and the dielectric strip have a gap of 0;

FIG. 9B is a graph which shows an insertion loss characteristic of the oscillator when the conductive plates and the dielectric strip have a gap of 0;

FIG. 11A is a graph which shows a reflection loss characteristic of the oscillator when only the conductive plates have a gap of 0.2 mm;

FIG. 11B is a graph which shows an insertion loss characteristic of the oscillator when only the conductive plates have a gap of 0.2 mm;

FIG. 12A is a perspective view of a measuring jig used for evaluation of a device with a nonradiative dielectric waveguide which is a second embodiment of the present invention and the oscillator mounted in the measuring jig;

FIG. 12B is a sectional view of the measuring jig and the oscillator, taken along a line XIIB—XIIB in FIG. 12A;

DETAILED DESCRIPTION OF THE PREFERRED EMBODIMENTS

Some exemplary measuring jigs according to the present invention are described with reference to the accompanying drawings.

Figure 1A:
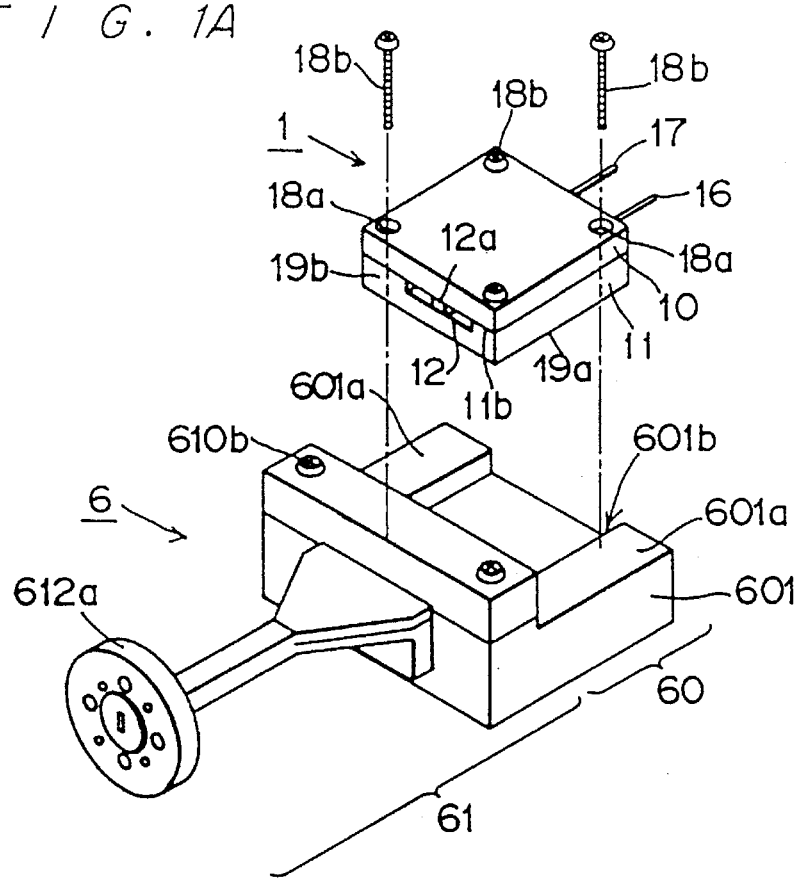
FIG. 1A is a perspective view of a measuring jig used for evaluation of a device with a nonradiative dielectric waveguide which is an embodiment of the present invention.
Figure 1B:
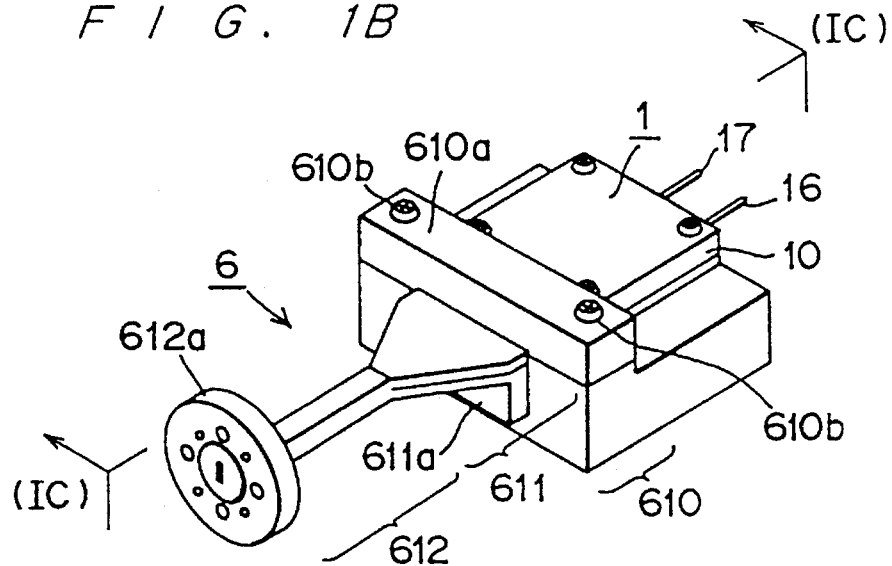
FIG. 1B is a perspective view of the measuring jig and an oscillator mounted in the measuring jig.
Figure 1C:
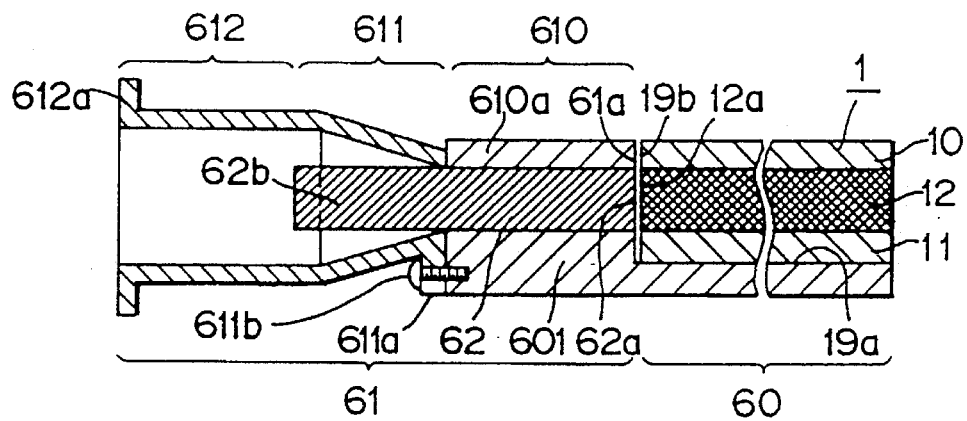
FIG. 1C is a sectional view of the measuring jig and the oscillator, taken along a line IC—IC in FIG. 1B.

FIGS. 1A through 1C show an oscillator 1 and a measuring jig 6 which is a first embodiment of the present invention. The oscillator 1 comprises a couple of rectangular conductive plates 10 and 11, a dielectric strip 12 and semiconductor chips (not shown) which are disposed between the conductive plates 10 and 11, a power terminal 16 and a modulating terminal 17. The conductive plates 10 and 11 are made of a conductive material such as aluminum, copper and the like. The conductive plate 11 has spacers 11b for keeping the space from the conductive plate 10 at a specified height a. The dielectric strip 12, as an example, is made of a dielectric material with a dielectric constant (εr) of 2 such as fluororesin, and is designed to have a height a of 2.25 mm and a width b of 2.5 mm. The conductive plates 10 and 11 have tapped holes 18a at the respective four corners. By tightening screws 18b into the tapped holes 18a, the dielectric strip 12 is fixed between the conductive plates 10 and 11.

The conductive plate 11 has a plane mounting surface 19a on the lower side. The laminated conductive plates 10 and 11 have an end surface 19b on which an end 12a of the dielectric strip 12 shows, and the end surface 19b is vertical to a direction in which a high-frequency electromagnetic wave travels. The oscillator 1 outputs an electromagnetic wave through the end 12a of the dielectric strip 12.

The measuring jig 6 comprises a mount section 60 and a converting section 61. The mount section 60 is formed in a part of a base plate 601 which is made of a conductive material such as aluminum, copper and the like. The base plate 601 has a couple of side walls 601a for positioning the oscillator 1. The base plate 601 further has tapped holes 601b, and when the oscillator 1 is mounted in the mount section 60 with the mounting surface 19a on the base plate 601, the tapped holes 18a of the oscillator 1 communicate with the tapped holes 601b of the base plate 601. Therefore, the oscillator 1 can be fixed on the base plate 601 by the screws 18b.

The converting section 61 is to connect the oscillator 1 to a transmission line, for example, a metal tubular waveguide. The converting section 61 comprises a pressing section 610, a dielectric strip 62, a horn 611 and a metal tubular waveguide 612. In the pressing section 610, the dielectric strip 62 is partly fixed between the base plate 601 and a pressing plate 610a by screws 610b. The horn 611 is fixed to the pressing section 610 by joining a flange 611a thereof to the pressing section 610 by a screw 611b. The waveguide 612 has a flange 612a on its end.

On the side of the converting section 61 which faces the oscillator 1, an end surface 61a on which an end 62a of the dielectric strip 62 shows is formed, and the end surface 61a is vertical to a direction in which an electromagnetic wave is propagated in the dielectric strip 62. The other end 62b of the dielectric strip 62 is tapered in the width way such that the characteristic impedance of the dielectric strip 62 will match the characteristic impedance of the transmission line to which the metal tubular waveguide 612 is connected.

Figure 2:
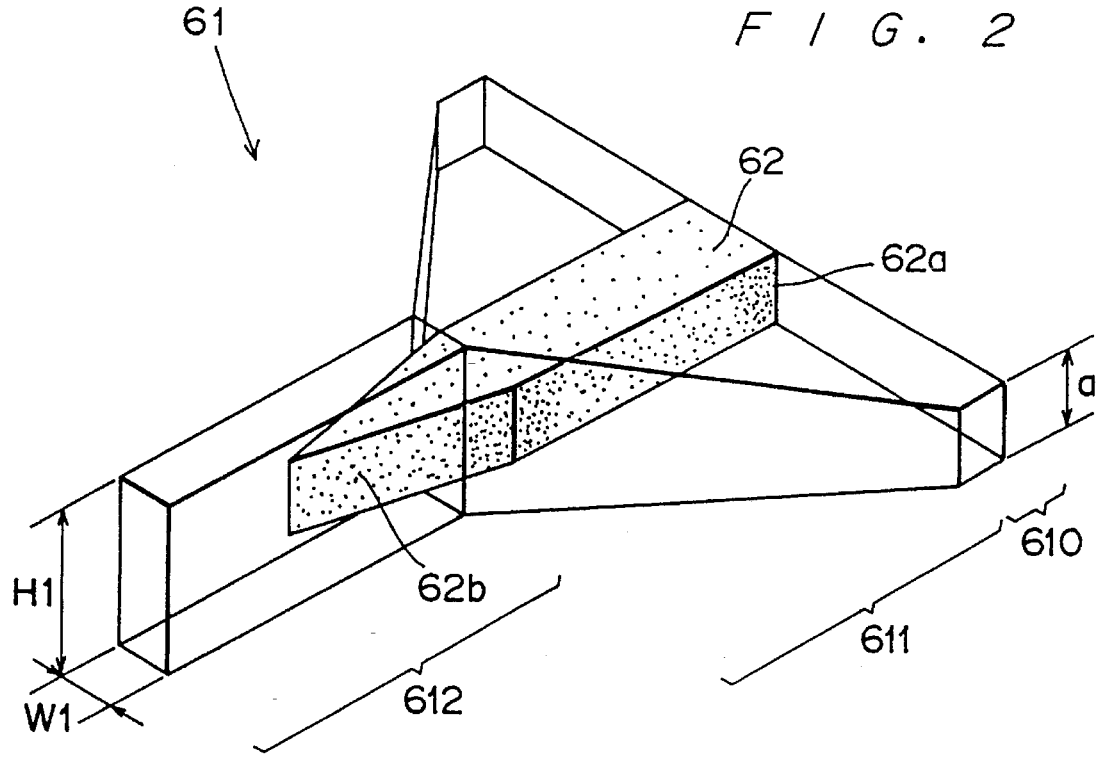
FIG. 2 is a perspective diagram of a converting section of the measuring jig of FIG. 1, showing the internal structure thereof.

FIG. 2 shows the internal structure of the converting section 61 of the measuring jig 6. The metal tubular waveguide 612 propagates an electromagnetic wave in TE10 mode, and has a width W1 of 1.88 mm and a height H1 of 3.76 mm. The dielectric strip 62 has a height a of 2.25 mm. The horn 611 is the same height as the waveguide 612 at the adjoining portion to the waveguide 612, and the height of the horn 611 becomes smaller gradually toward the pressing section 610. Then, at the adjoining portion to the pressing section 610, the horn 611 is the same height as the dielectric strip 62. On the other hand, the width of the horn 611 becomes larger toward the pressing section 610. Thereby, the characteristic impedance of an electromagnetic wave propagated in the dielectric strip 62 in LSM01 mode matches the characteristic impedance of an electromagnetic wave propagated in the waveguide 612 in TE10 mode. Since the dielectric strip 62 is fixed in the pressing section 610, positioning between the dielectric strip 62 and the horn 611 is always accurate.

Figure 3A:
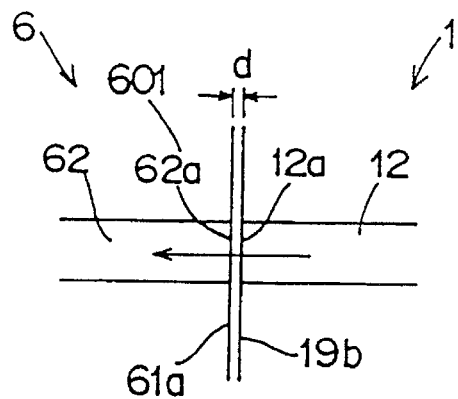
FIG. 3A is an internal plan view of a connecting portion between a dielectric strip of the oscillator and a dielectric strip of the measuring jig.

FIG. 3A is a plan view of a connecting portion between the dielectric strip 12 of the oscillator 1 and the dielectric strip 62 of the measuring jig 6, that is, the exposed end 12a of the dielectric strip 12 and the exposed end 62a of the dielectric strip 62. The ends 12a and 62a of the dielectric strips 12 and 62 are vertical to a direction in which an electromagnetic wave is propagated and are on a level with the end surface 19b of the oscillator 1 and the end surface 61a of the pressing section 610, respectively. The ends 12a and 62a are in contact with each other. The connection between the dielectric strips 12 and 62 is possible in other ways as illustrated in FIGS. 3B and 3C.

Figure 3B:
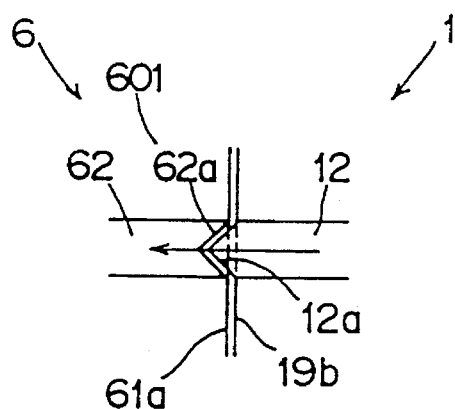
FIG. 3B is an internal plan view of a modification of the connecting portion between the dielectric strip of the oscillator and the dielectric strip of the measuring jig.
Figure 3C:
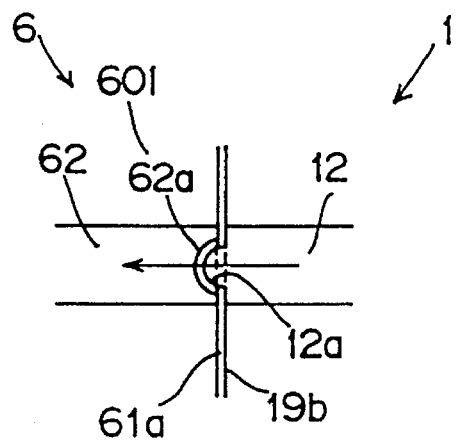
FIG. 3C is an internal plan view of another modification of the connecting portion between the dielectric strip of the oscillator and the dielectric strip of the measuring jig.

In FIG. 3B, the ends 12a and 62a of the dielectric strips 12 and 62 are wedges which engage with each other. The end 12a is slightly protruded from the end surface 19b of the oscillator 1. In FIG. 3C, the ends 12a and 62a of the dielectric strips 12 and 62 are round which engage with each other, and the end 12a is slightly protruded from the end surface 19b of the oscillator 1. As in the cases of FIGS. 3B and 3C, the ends 12a and 62a of the dielectric strips 12 and 62 do not have to be vertical to the electromagnetic wave propagation direction as long as the ends 12a and 62a engage with each other. It is also possible that the ends 12a and 62a which are vertical to the electromagnetic wave propagation direction are slightly protruded from the respective end surfaces 19b and 61a and are put into contact with each other. Further, in cases of FIGS. 3B and 3C, the end 61a of the dielectric strip 62, not the end 12a of the dielectric strip 12, may be protruded from the end surface 61a.

Next, the action of the oscillator 1 is described. When a direct current is supplied to the power terminal 16 of the oscillator 1, a high-frequency electromagnetic wave is generated and inputted into the dielectric strip 12. Suppose that the space between the conductive plates 10 and 11 is a and the generated electromagnetic wave has a wavelength of λ. If a<λ/2, the electromagnetic wave which is propagated in a parallel direction to the conductive plates 10 and 11 does not leak from the dielectric strip 12. The electromagnetic wave is propagated in the dielectric strip 12 and is outputted through the end 12a. When the oscillator 1 is mounted in the measuring jig 6, the oscillator 1 acts in the same way, and the electromagnetic wave is outputted through the end 12a in the pressing section 610. Possible transmission modes of an electromagnetic wave in a nonradiative dielectric waveguide are generally LSE mode and LSM mode. In order for a small loss, LSM01 mode which is the lowest mode of LSM mode is usually used.

Figure 4:
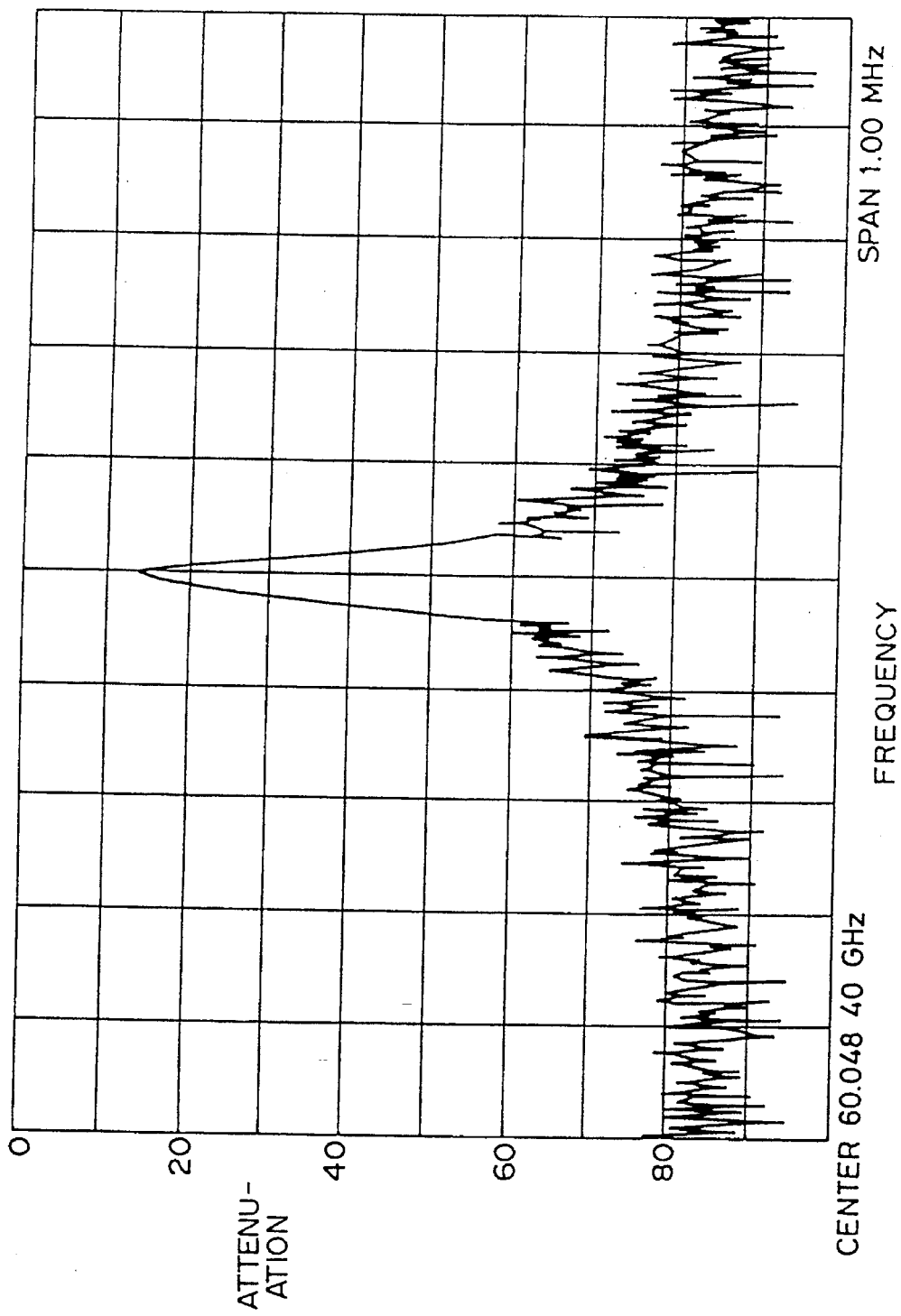
FIG. 4 is a graph which shows an oscillation characteristic of the oscillator.

The inventors evaluated the oscillator 1 by using the measuring jig 6 and a spectrum analyzer. FIG. 4 is a graph showing the oscillation characteristic of the oscillator 1. As is apparent from the graph of FIG. 4, an oscillation signal which has a resonance frequency of about 60 GHz and has a good waveform was outputted from the end 12a of the dielectric strip 12.

Figure 6A:
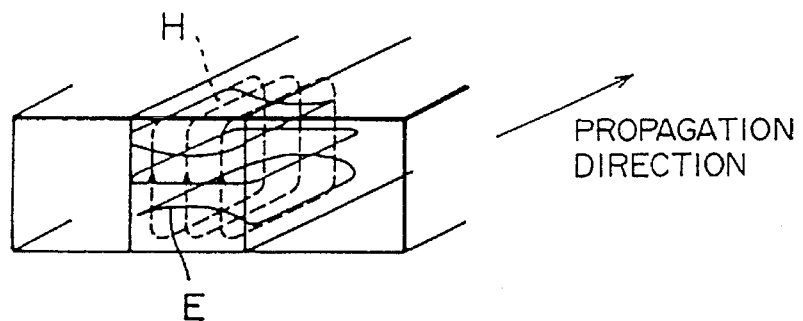
FIG. 6A is a distribution chart which shows an electric field and a magnetic field of an electromagnetic wave which is propagated in a nonradiative dielectric waveguide in LSM01 mode.
Figure 6B:
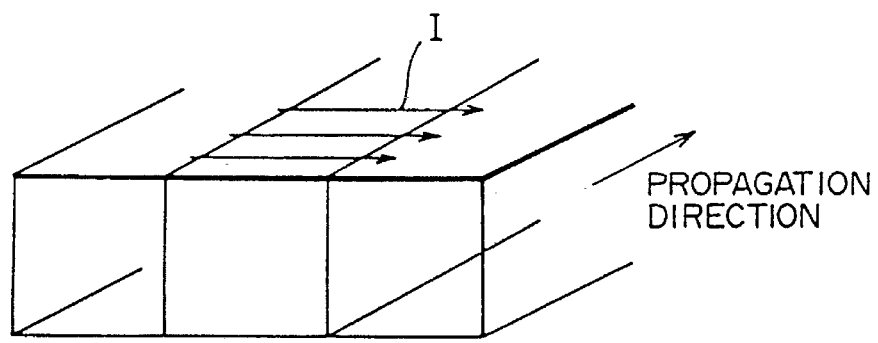
FIG. 6B is a distribution chart which shows a surface current of the electromagnetic wave which is propagated in the nonradiative dielectric waveguide in LSM01 mode.
Figure 6C:
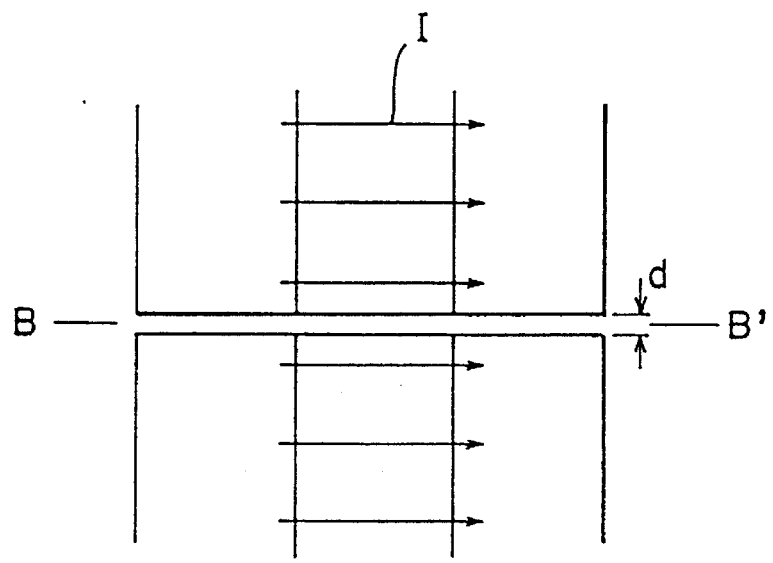
FIG. 6C is a plane distribution chart which shows the surface current of the electromagnetic wave when the nonradiative dielectric waveguide is cut off at a line B—B'.

Now, the difference between an electromagnetic wave propagated in a metal tubular waveguide and an electromagnetic wave propagated in a nonradiative dielectric waveguide is described. FIGS. 5A and 5B show an electromagnetic wave propagated in a metal tubular waveguide in TE10 mode. FIG. 5A shows the electric field E and the magnetic field H of the electromagnetic wave, and FIG. 5B shows the surface current I. FIGS. 6A, 6B and 6C show an electromagnetic wave propagated in a nonradiative dielectric waveguide in LSM01 mode. FIG. 6A shows the electric field E and the magnetic field H of the electromagnetic wave, and FIGS. 6B and 6C show the surface current I. FIG. 6C shows a state wherein the nonradiative dielectric waveguide is cut off at a line B—B'.

As is apparent from FIG. 5B, the surface current I of an electromagnetic wave propagated in a metal tubular waveguide has a component in the electromagnetic wave propagation direction. Therefore, in connecting the metal tubular waveguide to another metal tubular waveguide, the waveguides must be joined firmly without space by a flange. Otherwise, the surface current I will not flow from one of the waveguides to the other waveguide.

On the other hand, the surface current I of an electromagnetic wave propagated in a nonradiative dielectric waveguide in LSM01 mode, as is apparent from FIG. 6B, has only a component in a direction perpendicular to the electromagnetic wave propagation direction. Therefore, even if the conductive plates and the dielectric strip of the nonradiative dielectric waveguide are cut off perpendicularly to the electromagnetic wave propagation direction, that is, even if the nonradiative dielectric waveguide has a gap, the gap will not influence transmission of the electromagnetic wave.

Figure 7A:
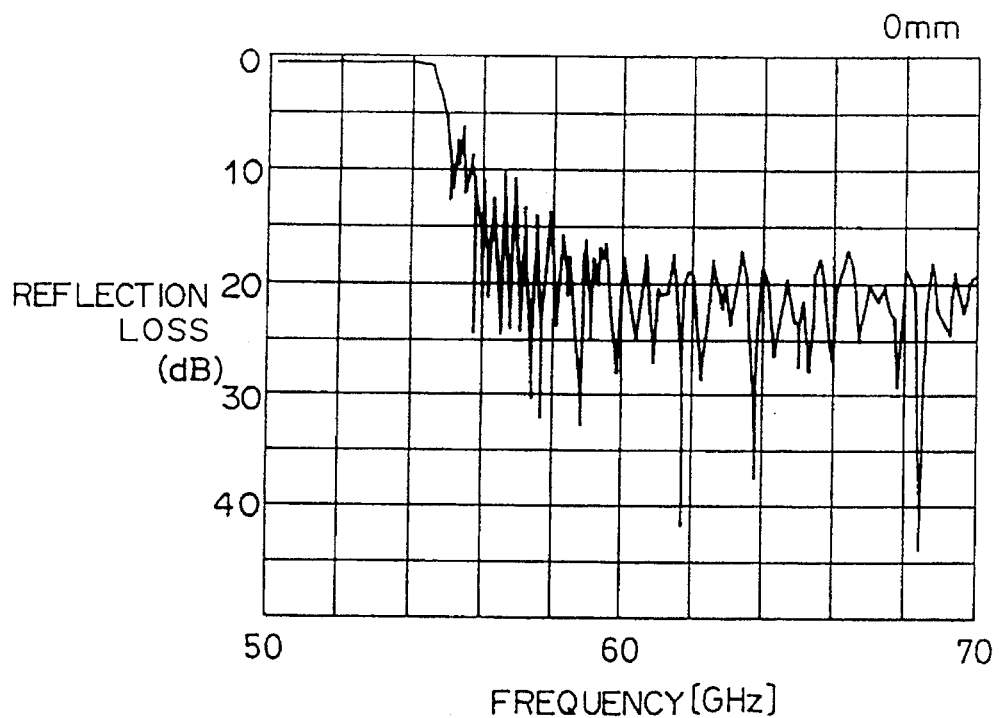
FIG. 7A is a graph which shows a reflection loss characteristic of the oscillator when conductive plates and the dielectric strip have a gap of 0.
Figure 7B:
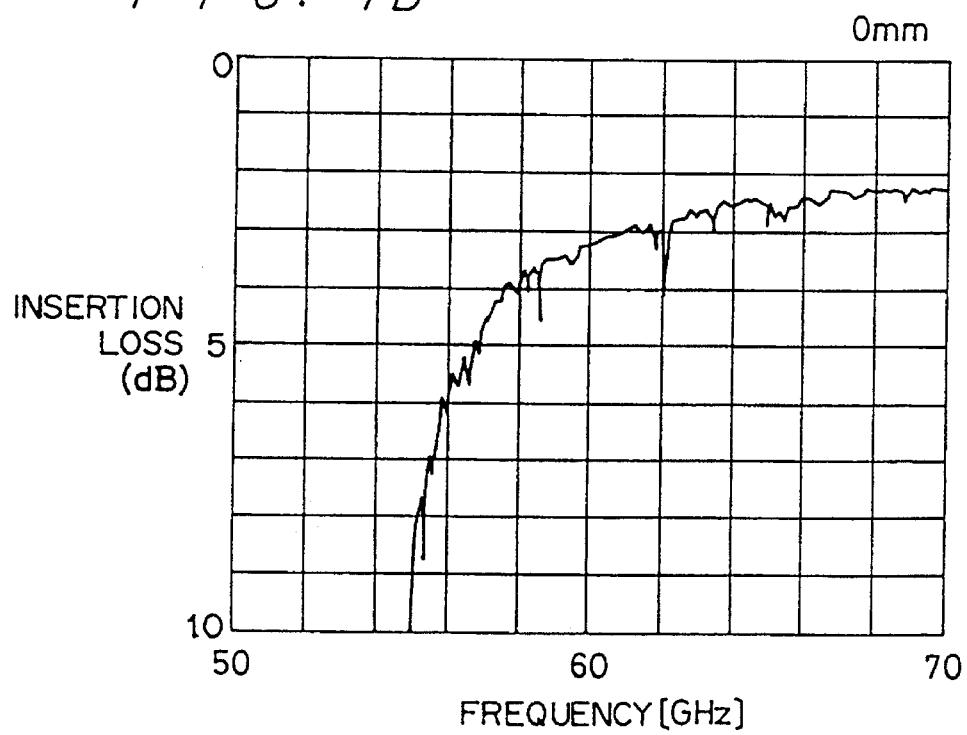
FIG. 7B is a graph which shows an insertion loss characteristic of the oscillator when the conductive plates and the dielectric strip have a gap of 0.
Figure 8A:
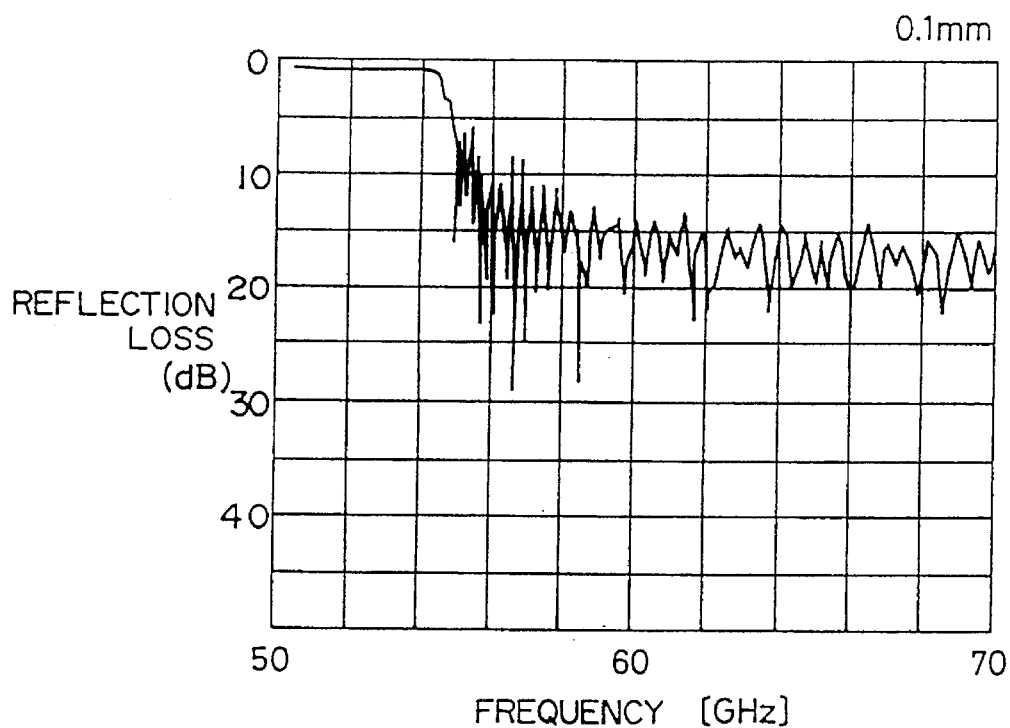
FIG. 8A is a graph which shows a reflection loss characteristic of the oscillator when the conductive plates and the dielectric strip have a gap of 0.1 mm.
Figure 8B:
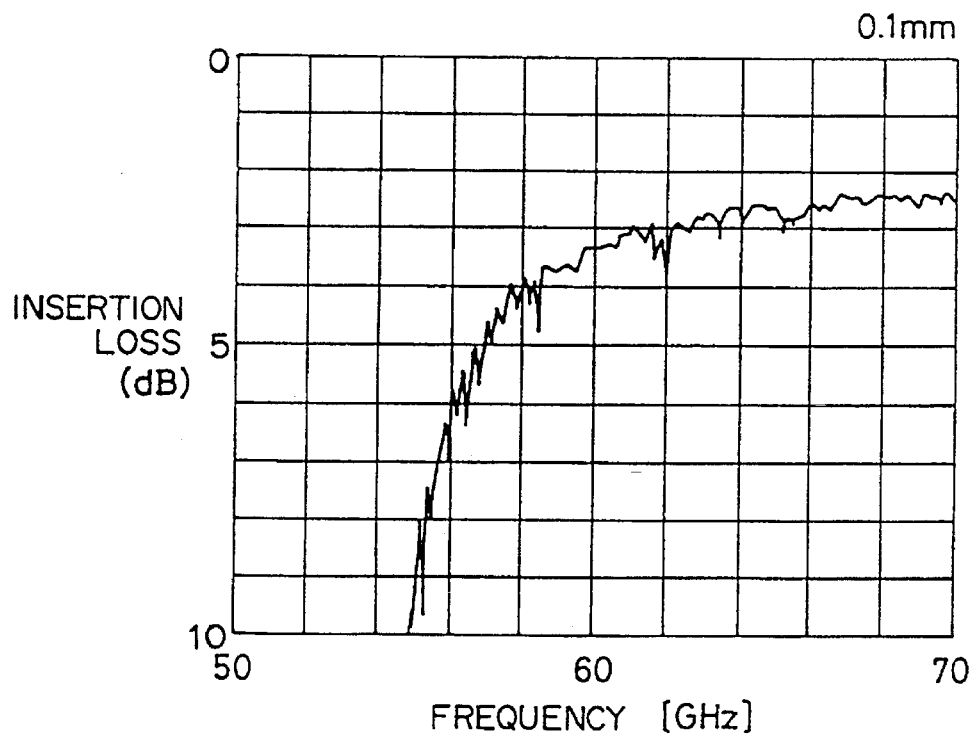
FIG. 8B is a graph which shows an insertion loss characteristic of the oscillator when the conductive plates and the dielectric strip have a gap of 0.1 mm.

In order to prove this assumption, the inventors measured the characteristics of the oscillator 1 when the conductive plates 10 and 11 and the dielectric strip 12 were cut off to have a gap d in a direction perpendicular to the electromagnetic wave propagation direction. FIGS. 7A and 7B show the characteristics when the gap d was 0. FIGS. 8A and 8B show the characteristics when the gap d was 0.1 mm. As is apparent from FIGS. 7A through 8B, the reflection loss and the insertion loss of the oscillator 1 were only a little increased when the oscillator 1 had a gap of 0.1 mm.

Now, this is applied to the connection between the dielectric strip 12 of the oscillator 1 and the dielectric strip 62 of the measuring jig 6. The case of FIGS. 7A and 7B corresponds to a case wherein the end surface 19b of the oscillator 1 and the end 12a of the dielectric strip 12 are in contact with the end surface 61a of the pressing section 610 and the end 62a of the strip 62, respectively (d=0 in FIG. 3A). The case of FIGS. 8A and 8B corresponds to a case wherein there is a gap d of 0.1 mm between the level of the end surface 19b and the end 12a and the level of the end surface 61a and the end 62a (d=0.1 mm in FIG. 3A). From the result of the experiment, it can be inferred that a slight gap between the end 12a and the end 62a is allowable. Accordingly, the connection between the oscillator 1 and the measuring jig 6 does not require firm joining by use of a flange, and pushing between the end 12a of the dielectric strip 12 and the end 62a of the dielectric strip 62 is not necessary. Therefore, only by mounting the oscillator 1 in the mount section 60 of the measuring jig 6 with the mounting surface 19b of the oscillator 1 on the base plate 601, an electromagnetic wave is propagated in the dielectric strips 12 and 62 in LSM01 mode without mismatching and with a small loss. Thus, the characteristics of the oscillator 1 can be measured accurately in a simple way.

Further, in order to estimate the characteristics in a case wherein the end 12a of the dielectric strip 12 and the end 62a of the dielectric strip 62 which are slightly protruded from the end surfaces 19b and 61a respectively are put into contact with each other, the inventors conducted an experiment in the following way. The conductive plates 10 and 11 and the dielectric strip 12 were cut off perpendicularly to the electromagnetic wave propagation direction. Then, the cut ends of the dielectric strip 12 were put into contact again, while the conductive plates 10 and 11 were rearranged to have a gap d between the respective cut ends. In this state, the characteristics of the oscillator 1 were measured.

Figure 10A:
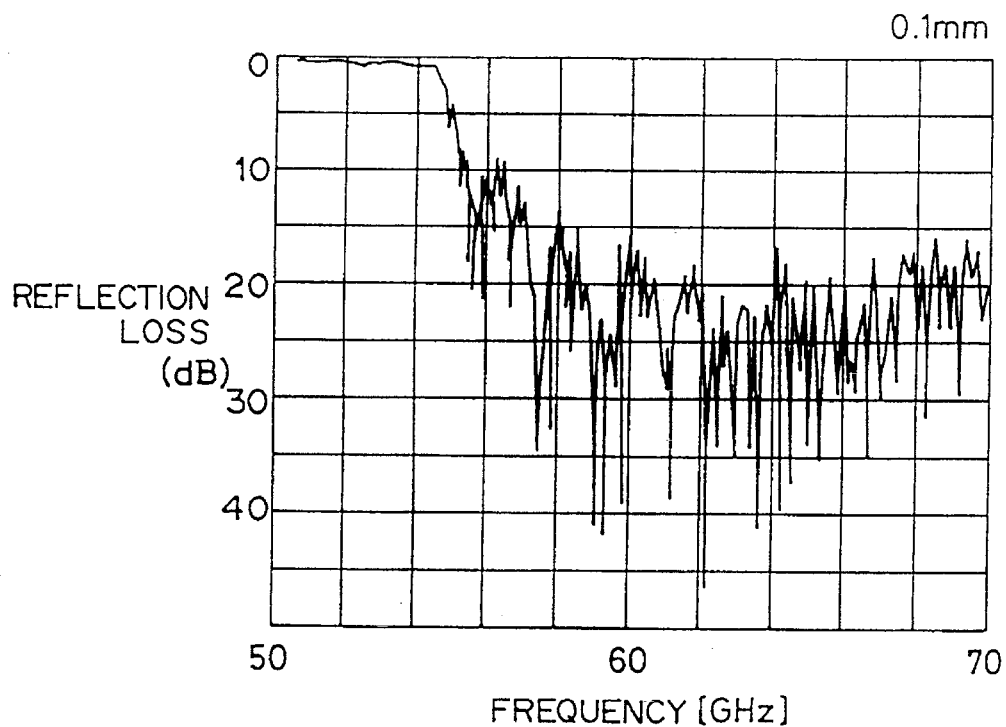
FIG. 10A is a graph which shows a reflection loss characteristic of the oscillator when only the conductive plates have a gap of 0.1 mm.
Figure 10B:
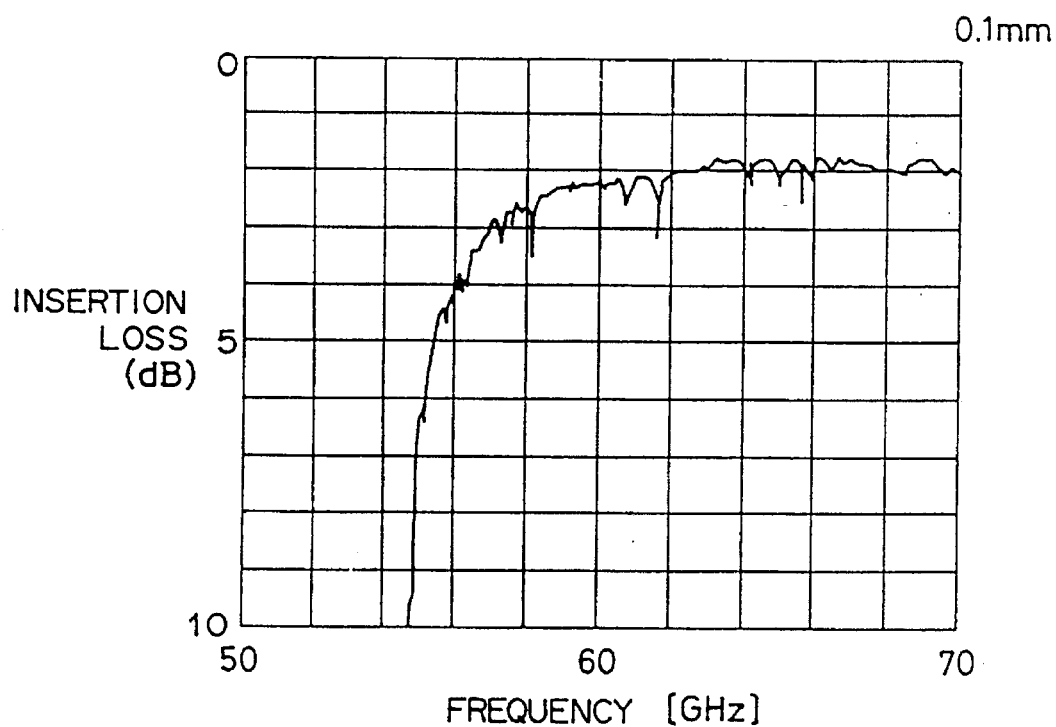
FIG. 10B is a graph which shows an insertion loss characteristic of the oscillator when only the conductive plates have a gap of 0.1 mm.

FIGS. 9A and 9B show the characteristics when the gap d was 0, and more specifically when the cut ends of the dielectric strip 12 and the cut ends of the conductive plates 10 and 11 were joined again. FIGS. 10A and 10B show the characteristics when the gap d was 0.1 mm, and more specifically when the cut ends of the dielectric strip 12 were protruded from the respective cut ends of the conductive plates 10 and 11 by 0.05 mm and were put into contact with each other. FIGS. 11A and 11B show the characteristics when the gap d was 0.2 mm, and more specifically when the cut ends of the dielectric strip 12 were protruded from the respective cut ends of the conductive plates 10 and 11 by 0.1 mm and were put into contact with each other.

As is apparent from FIGS. 9A through 11B, even if there is a gap d between the conductive plates 10 and 11, the reflection loss and the insertion loss of the oscillator 1 hardly change as long as the cut ends of the dielectric strip 12 are in contact with each other. This is applicable to the connection between the oscillator 1 and the measuring jig 6. Therefore, even if the end 12a of the strip 12 and the end 62a of the strip 62 are slightly protruded from the respective end surfaces 19b and 61a, as long as the ends 12a and 62a are in contact with each other, the reflection loss and the insertion loss will hardly change.

FIGS. 12A and 12B show the oscillator 1 and a measuring jig 6A which is a second embodiment of the present invention. The measuring jig 6A has a base plate 63, an upper plate 64 and a dielectric strip 65 which have specified configurations. The base plate 63 and the upper plate 64, and the dielectric strip 65 form a converting section 66 which includes a pressing section, a horn and a waveguide.

Figure 13:
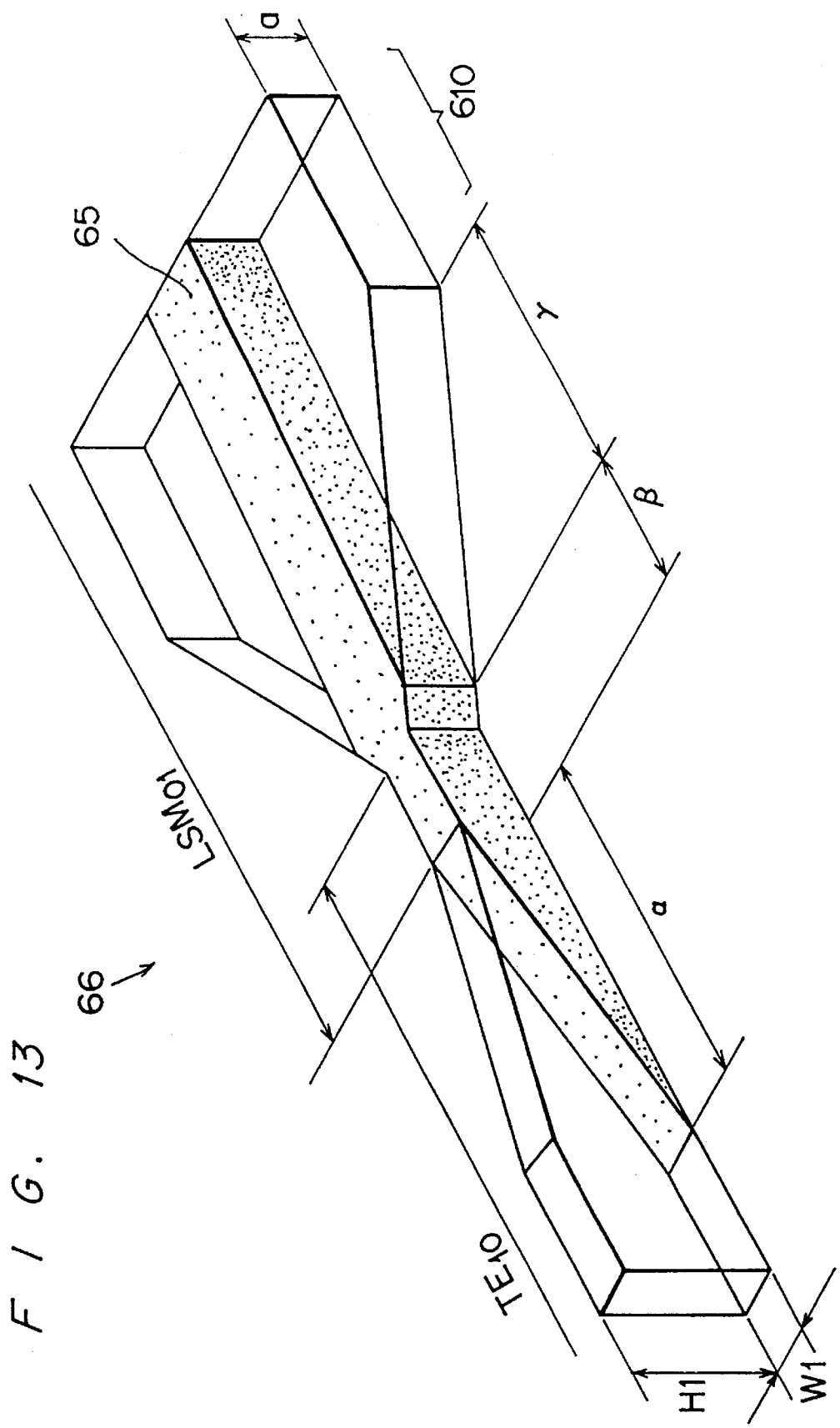
FIG. 13 is a perspective diagram of a converting section of the measuring jig of FIG. 12A, showing the internal structure thereof.

FIG. 13 shows the internal structure of the converting section 66 of the measuring jig 6A. The upper plate 64 and the dielectric strip 65 are linearly tapered in the height way. The horn and the pressing section have a fixed height a. The structure of the converting section 66 of the measuring jig 6A is simpler than that of the converting section 61 of the measuring jig 6. In the converting section 66, a TE10 mode section $\alpha$, a buffer section $\beta$ where an electromagnetic wave in TE10 mode and an electromagnetic wave in LSM01 mode are mixed, an LSM01 mode section $\gamma$ are formed. Mode conversion between TE10 mode and LSM01 mode is carried out gradually in these sections $\alpha$, $\beta$ and $\gamma$. Therefore, degradation of characteristics caused by the mode conversion can be inhibited, and characteristics of the oscillator 1 can be measured accurately. Further, the dielectric strip 65 is fixed not only in the pressing section 610 but also in the buffer section $\beta$ and the LSM01 mode section $\gamma$, and thereby, positioning of the dielectric strip 65 is more accurate.

Figure 14:
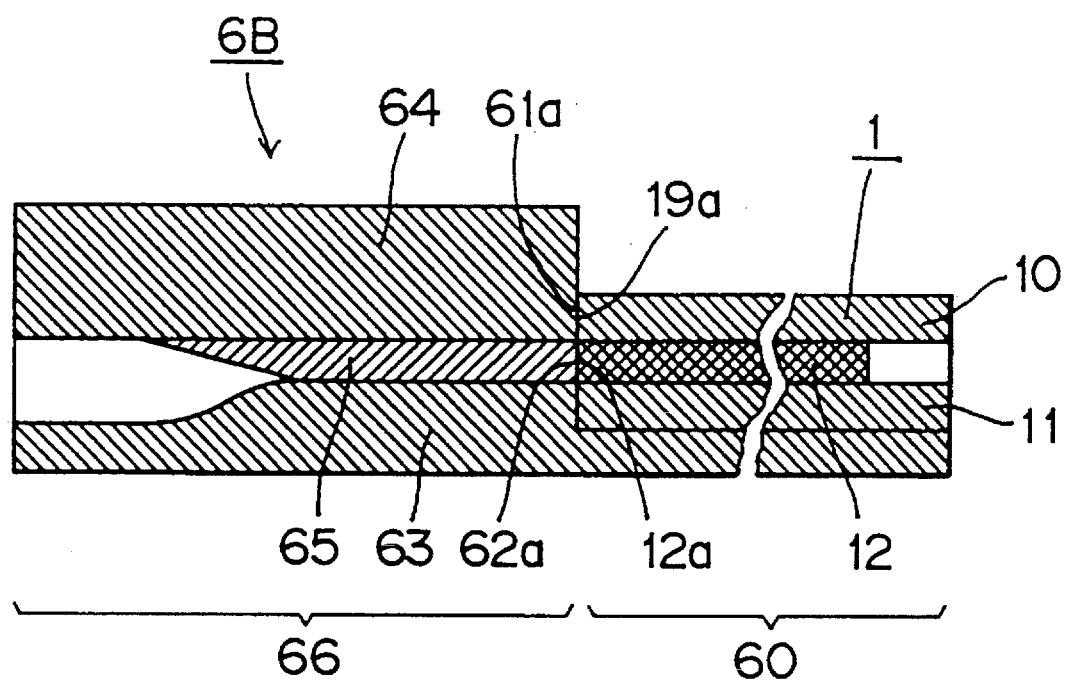
FIG. 14 is a sectional view of a measuring jig used for evaluation of a device with a nonradiative dielectric waveguide which is a third embodiment of the present invention and the oscillator mounted in the measuring jig.

FIG. 14 shows the oscillator 1 and a measuring jig 6B which is a third embodiment of the present invention. The measuring jig 6B has a base plate 63, an upper plate 64 and a dielectric strip 65 which have specified configurations, and these form a converting section 66. The dielectric strip 65 is linearly tapered in the height way, and the base plate 63 is tapered round in the height way. A horn and a pressing section which have a fixed height a are formed. This measuring jig 6B brings the same effect as the measuring jig 6A.

Figure 15:
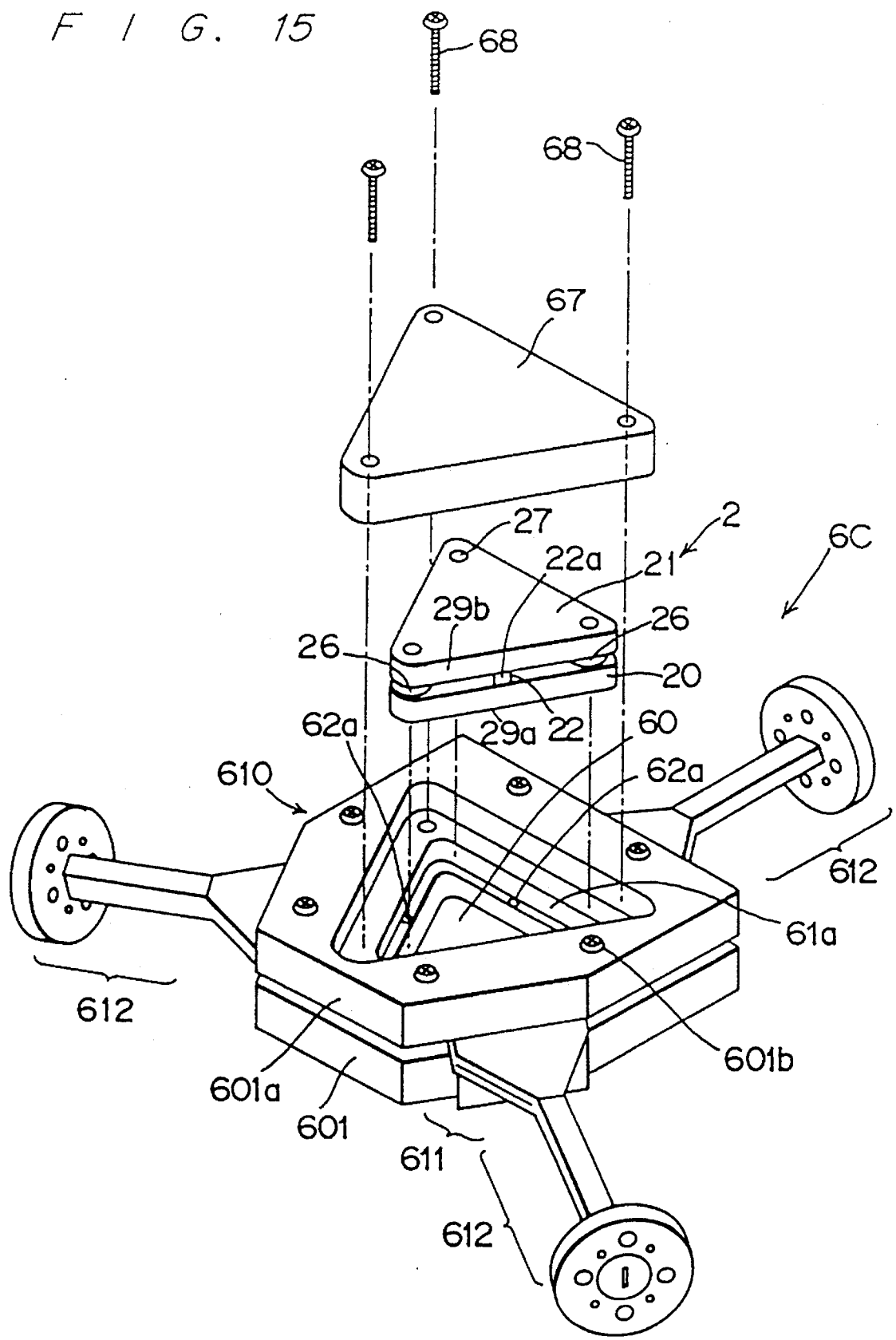
FIG. 15 is a perspective view of a measuring jig used for evaluation of a device with a nonradiative dielectric waveguide which is a fourth embodiment of the present invention and a circulator mounted in the measuring jig.

FIG. 15 shows a circulator 2 and a measuring jig 6C which is a fourth embodiment of the present invention. The same parts and members which are shown in FIGS. 1A through 1C are provided with the same reference symbols, and the description thereof is omitted.

The circulator 2 comprises a couple of triangular conductive plates 20 and 21, and three dielectric strips 22 (although only one dielectric strip is seen in FIG. 15) and magnetic parts (not shown) which are disposed between the conductive plates 20 and 21. The conductive plates 20 and 21 are made of a conductive material such as aluminum, copper and the like. Between the conductive plates 20 and 21, spacers 26 for keeping the space therebetween at a specified height a are provided at the three corners. Tapped holes (not shown) are made in the conductive plates 20 and 21 at the respective three corners such that the tapped holes communicate with the spacers 26. By tightening screws 27 into the tapped holes, the dielectric strips 22 and the magnetic parts are fixed between the conductive plates 20 and 21.

The conductive plate 20 has a plane mounting surface 29a on the lower side. On the three end surfaces 29b of the laminated conductive plates 20 and 21, respective ends 22a of the dielectric strips 22 show, and the end surfaces 29b are vertical to directions in which a high-frequency electromagnetic wave which is inputted or outputted through the ends 22a of the dielectric strips 22 travels.

Since the circulator 2 has three exposed ends 22a of the dielectric strips 22, that is, three ports, the measuring jig 6C has a structure which is a combination of three measuring jigs 6 of the first embodiment. The circulator 2 is placed in a mount section 60 of the measuring jig 6C guided by three vertical surfaces 61a. In this moment, if even one of the screws 27 comes off the circulator 2, the dielectric strips 22 may be out of position. In order to prevent this trouble, a lid 67 is put on the circulator 2, and the circulator 2 is fixed in the measuring jig 6C by screws 68. In this state, the characteristics of the circulator 2 are measured.

When a high-frequency electromagnetic wave is inputted into the circulator 2 through one of the three ports (one of the ends 22a of the strips 22), the electromagnetic wave is propagated only to a specified one of the other two ports. The inventors evaluated the circulator 2 by using the measuring jig 6C and a network analyzer. The evaluation was carried out while the circulator 2 is used as an isolator with one of the ends 22a of the dielectric strips 22 serving as a nonreflective terminal.

Figure 16A:
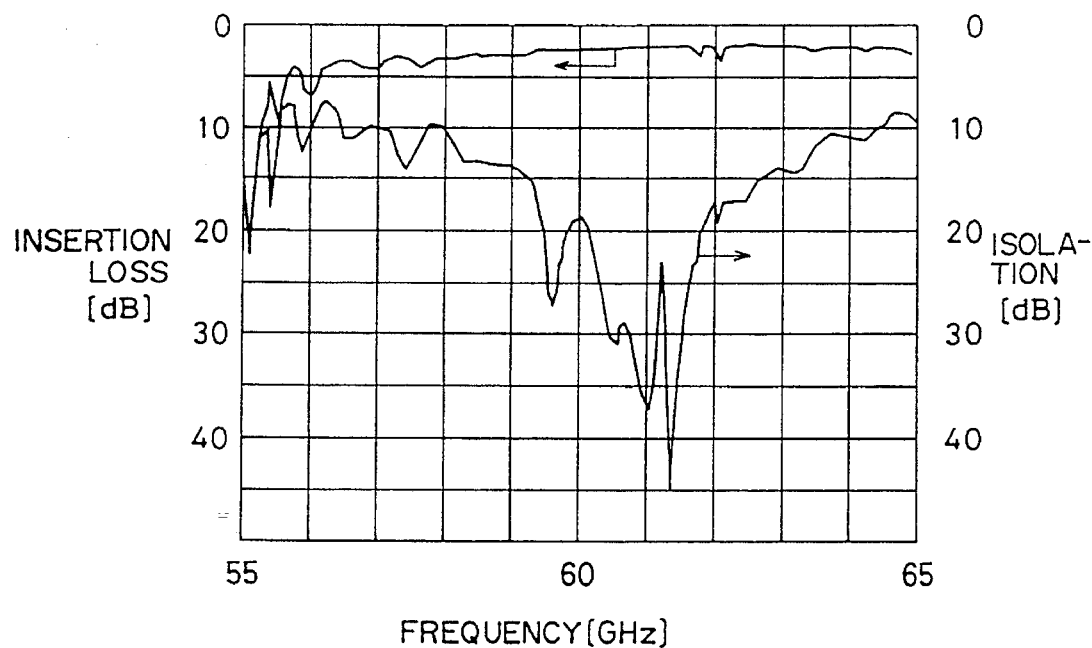
FIG. 16A is a graph which shows an insertion loss characteristic and an isolation characteristic of the circulator.
Figure 16B:
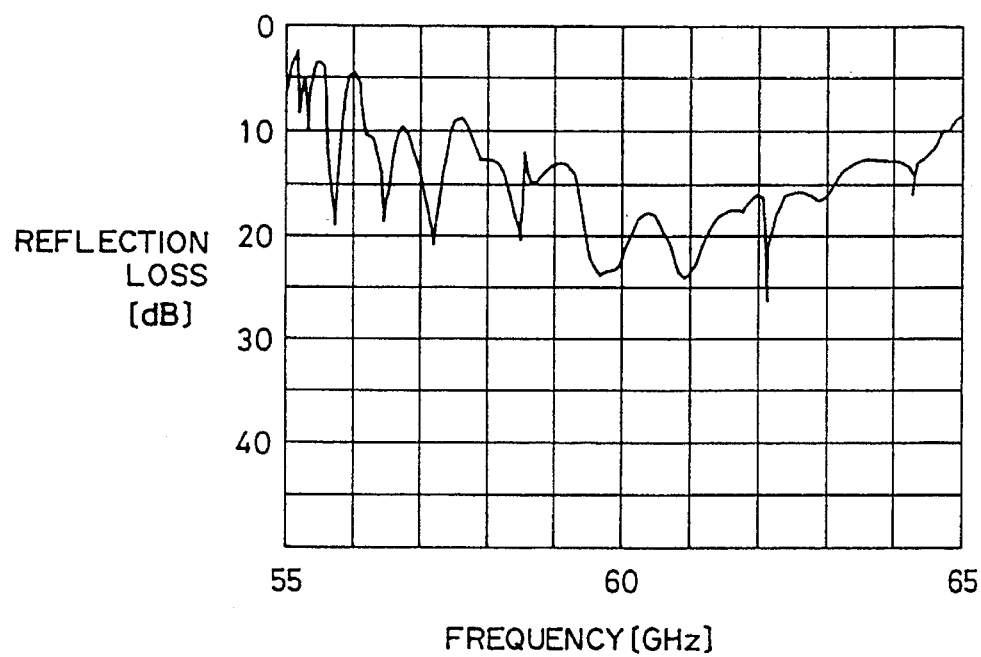
FIG. 16B is a graph which shows a reflection loss characteristic of the circulator.
Figure 17:
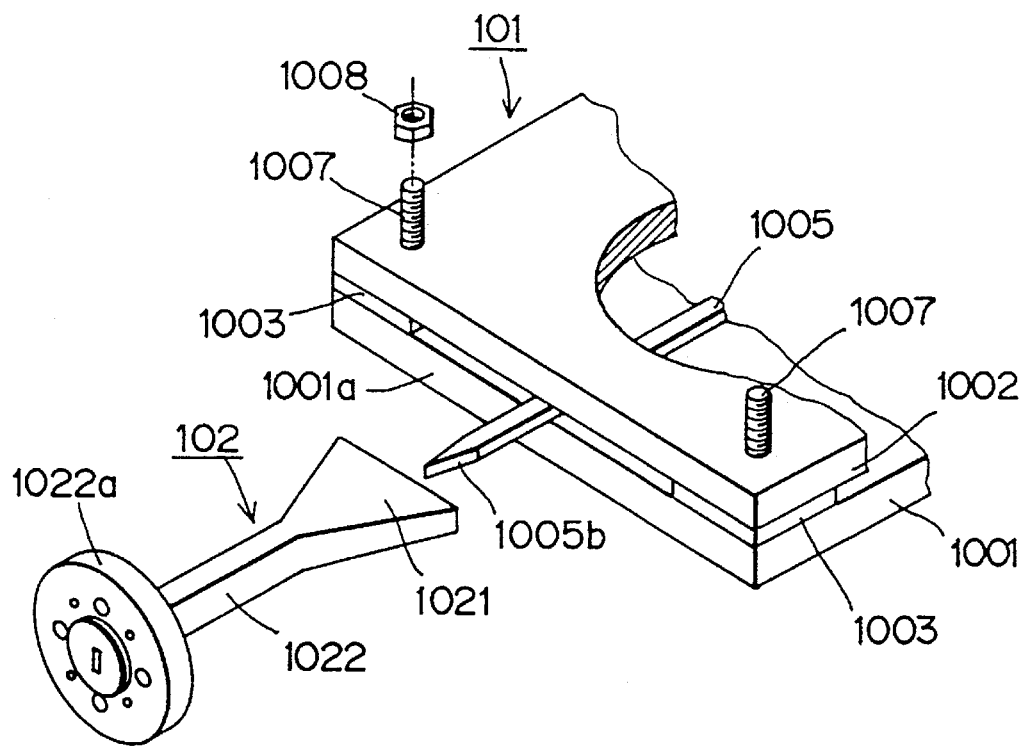
FIG. 17 is a perspective view of a conventional measuring jig used for a device with a nonradiative dielectric waveguide.
Figure 18:
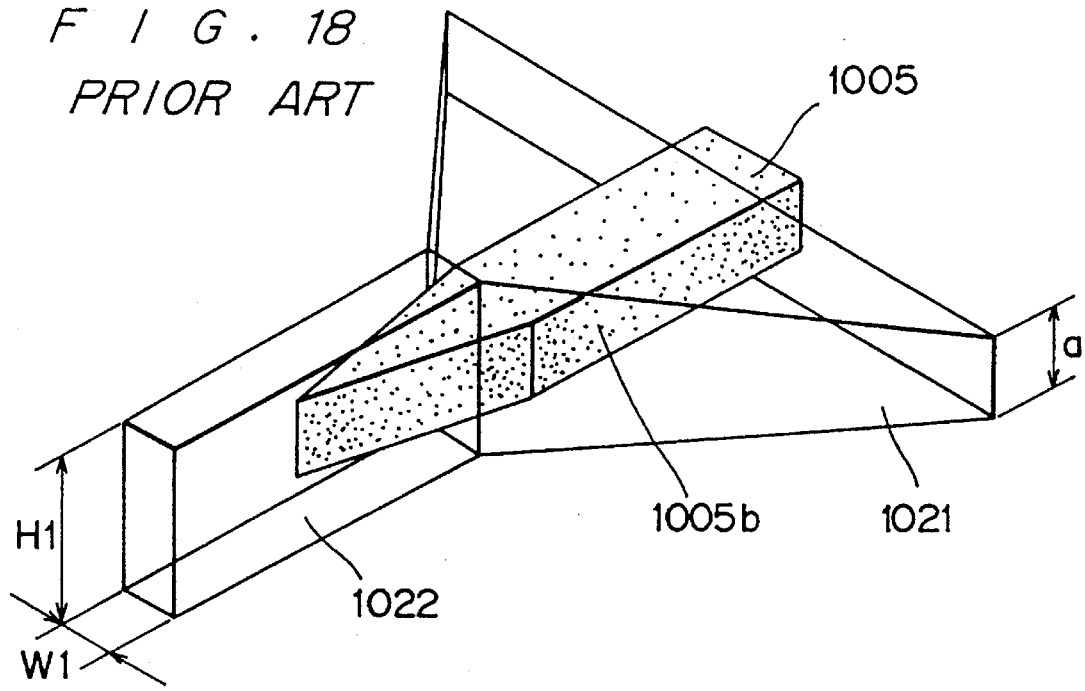
FIG. 18 is a perspective diagram of the measuring jig of FIG. 17 when an end of a dielectric strip of a device with a nonradiative dielectric waveguide is inserted therein.

FIGS. 16A and 16B show the results of the evaluation. As is apparent from FIGS. 16A and 16B, the circulator 2 has a good isolation characteristic, a good insertion loss characteristic and a good reflection loss characteristic.

In this way, the characteristics of the circulator 2 can be measured only by setting and screwing the circulator 2 in the measuring jig 6C. The connection between the circulator 2 and the measuring jig 6C does not require firm joining by use of a flange, and pushing between the ends 22a of the dielectric strips 22 and the ends 62a of the dielectric strips 62 is not necessary. When the circulator 2 is fixed in the measuring jig 6C with the mounting surface 29a of the circulator 2 on the mount section 60, an electromagnetic wave is propagated to a specified one of the dielectric strips 62 through the dielectric strips 22 in LSM01 mode without mismatching and with a small loss. Thus, by using the measuring jig 6C, the characteristics of the circulator 2 can be measured accurately in a simple way. Further, the measuring jig for the circulator 2 can be produced as a combination of three measuring jigs 6A of the second embodiment or a combination of three measuring jigs 6B of the third embodiment.

In the above embodiments, measuring jigs which are used for evaluation of the oscillator 1 and the circulator 2 have been described. However, the present invention is applicable to measuring jigs used for evaluation of other devices with a nonradiative dielectric waveguide, such as a coupler, a mixer, a nonreflective terminal, etc. Also, the present invention is applicable to measuring jigs which are used for evaluation of not only devices with a nonradiative dielectric waveguide which operate in a millimeter wave band but also devices with a nonradiative dielectric waveguide which operate in a microwave band. Further, it is possible to produce measuring jigs for two-port devices and four-port devices.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A measuring jig used for evaluation of a device with a nonradiative dielectric waveguide, the device with a nonradiative dielectric waveguide operating in a microwave band or in a millimeter wave band, the device with the nonradiative dielectric waveguide comprising:

a couple of first conductors which are parallel to each other at a specified space;

a first dielectric strip which is disposed between the first conductors, the first dielectric strip propagating a high-frequency electromagnetic wave at a specified mode;

a plane mounting surface which is formed on at least either of the first conductors; and a first end surface which is formed on an end of the first conductors so as to be vertical to a direction in which the high frequency electromagnetic wave is propagated in the first dielectric strip, an end of the first dielectric strip being exposed on the first end surface, the measuring jig comprising:

a mount section on which the device with the nonradiative dielectric waveguide is to be mounted, the mount section having a surface which is to entirely come into contact with the plane mounting surface of the device;

a converting section which is integral with the mount section and connects the device with the nonradiative dielectric waveguide mounted on the mount section to an external circuit, the converting section comprising:

a couple of second conductors which are parallel to each other at a specified space;

a second dielectric strip which is disposed between the second conductors; and a second end surface which is formed on an end of the second conductors so as to be vertical to a direction in which a high-frequency electromagnetic wave is propagated in the second dielectric strip, the second end surface facing the first end surface, and an end of the second dielectric strip being exposed on the second end surface so as to face the end of the first dielectric strip.

2. A measuring jig as claimed in claim 1, wherein the exposed end of the second dielectric strip has a projection which protrudes from the end surface of the conductors.

3. A measuring jig as claimed in claim 1, wherein the exposed end of the second dielectric strip has a recess which is retracted from the end surface of the conductors.

4. A measuring jig as claimed in claim 1, wherein the converting section further comprising:

a metal tubular waveguide;

a horn for matching a characteristic impedance of the metal tubular waveguide to a characteristic impedance of the second dielectric strip.

* * * * *